US008507888B2

(12) United States Patent
Aoyama et al.

(10) Patent No.: US 8,507,888 B2
(45) Date of Patent: Aug. 13, 2013

(54) NONVOLATILE MEMORY DEVICE AND METHOD FOR MANUFACTURING SAME

(75) Inventors: Kenji Aoyama, Kanagawa-ken (JP);
Kazuhiko Yamamoto, Kanagawa-ken (JP); Satoshi Ishikawa, Kanagawa-ken (JP); Shigeto Oshino, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 13/018,765

(22) Filed: Feb. 1, 2011

(65) Prior Publication Data
US 2012/0056145 A1 Mar. 8, 2012

(30) Foreign Application Priority Data
Sep. 8, 2010 (JP) ................................. 2010-200620

(51) Int. Cl.
*H01L 45/00* (2006.01)
(52) U.S. Cl.
USPC ......... 257/2; 257/E45.001; 977/472; 977/943
(58) Field of Classification Search
USPC ...................... 257/2, E45.001; 977/742, 943
See application file for complete search history.

(56) References Cited

U.S. PATENT DOCUMENTS

| 7,851,777 | B2 * | 12/2010 | Arai et al. ......................... 257/2 |
| 8,309,257 | B2 * | 11/2012 | Kanamura et al. ............ 429/304 |
| 2010/0006812 | A1 * | 1/2010 | Xu et al. ........................... 257/2 |
| 2010/0108982 | A1 * | 5/2010 | Ping et al. ........................ 257/5 |
| 2011/0194304 | A1 * | 8/2011 | Han et al. ...................... 362/555 |
| 2012/0012803 | A1 * | 1/2012 | Oshino ............................. 257/2 |
| 2012/0104352 | A1 * | 5/2012 | Aoyama et al. .................. 257/5 |
| 2012/0205612 | A1 * | 8/2012 | Tabata et al. ..................... 257/5 |

FOREIGN PATENT DOCUMENTS

JP 2010-9669 1/2010

OTHER PUBLICATIONS

U.S. Appl. No. 13/052,426, filed Mar. 21, 2011, Aoyama, et al.
U.S. Appl. No. 13/052,356, filed Mar. 21, 2011, Nakao, et al.
U.S. Appl. No. 12/973,183, filed Dec. 20, 2010, Shigeto Oshio.

* cited by examiner

*Primary Examiner* — Victor A Mandala
(74) *Attorney, Agent, or Firm* — Oblon, Spivak, McClelland, Maier & Neustadt, L.L.P.

(57) ABSTRACT

According to one embodiment, a nonvolatile memory device includes a selection element layer and a nanomaterial aggregate layer. The selection element layer includes silicon. The nanomaterial aggregate layer is stacked on the selection element layer. The nanomaterial aggregate layer includes a plurality of micro conductive bodies and fine particles dispersed in a plurality of gaps between the micro conductive bodies. At least a surface of the fine particle is made of an insulating material other than silicon oxide.

7 Claims, 9 Drawing Sheets

VERTICAL DIRECTION

WORD LINE DIRECTION

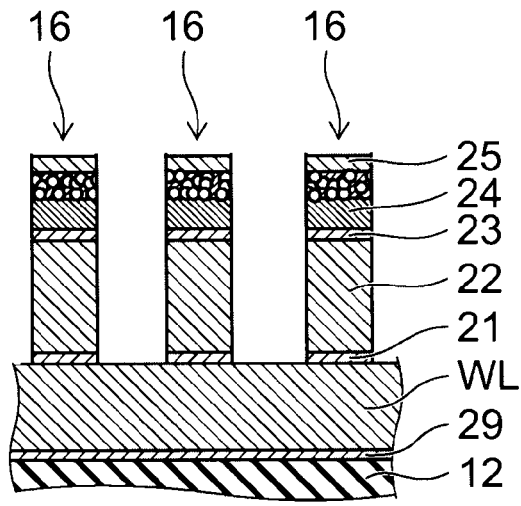
FIG. 7A
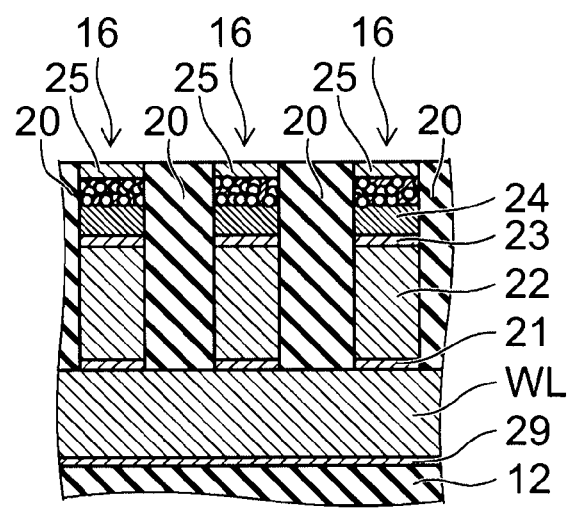
FIG. 7B
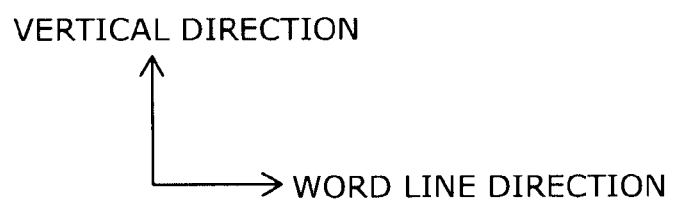

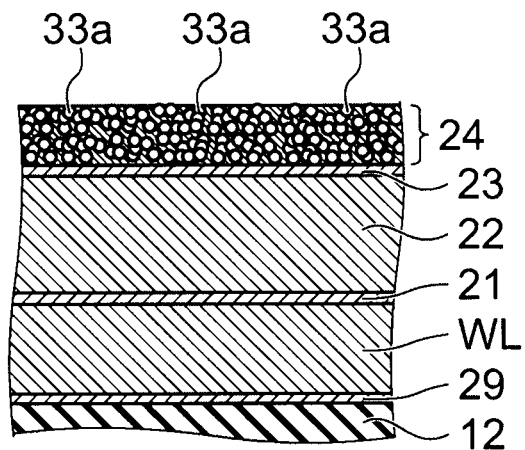
FIG. 10A
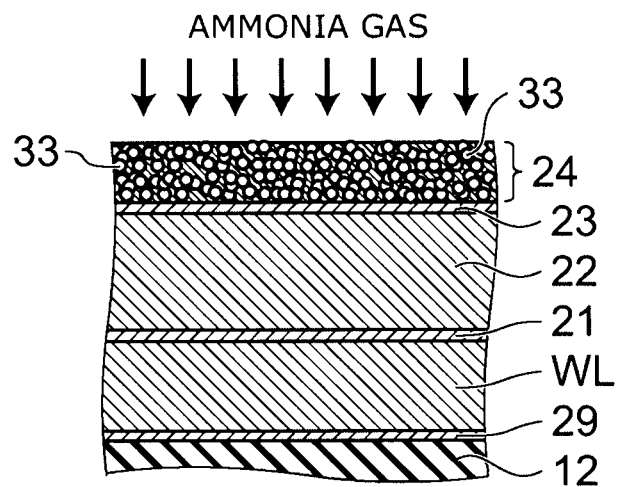
FIG. 10B
VERTICAL DIRECTION
WORD LINE DIRECTION

US 8,507,888 B2

NONVOLATILE MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2010-200620, filed on Sep. 8, 2010; the entire contents of which are incorporated herein by reference.

FIELD

Embodiments described herein relate generally to a nonvolatile memory device and a method for manufacturing the same.

BACKGROUND

In recent years, a phenomenon was discovered in which certain metal oxide materials have two states of a low resistance state and a high resistance state when a voltage is applied to the material due to the resistivity prior to the voltage application and the size of the applied voltage; and new nonvolatile memory devices utilizing such a phenomenon are drawing attention. Such a nonvolatile memory device is called ReRAM (Resistance Random Access Memory). Three-dimensional cross-point structures in which memory cells are disposed at the intersection points between WLs (word lines) and BLs (bit lines) have been proposed as the actual device structure of ReRAM from the viewpoint of higher integration. Even higher integration is desirable for ReRAM.

BRIEF DESCRIPTION OF THE DRAWINGS

FIGS. 7A and 7B are cross-sectional views of processes, illustrating the method for manufacturing the nonvolatile memory device according to the first embodiment;

FIGS. 10A and 10B are cross-sectional views of processes, illustrating a method for manufacturing the nonvolatile memory device according to the second embodiment.

DETAILED DESCRIPTION

In general, according to one embodiment, a nonvolatile memory device includes a selection element layer and a nanomaterial aggregate layer. The selection element layer includes silicon. The nanomaterial aggregate layer is stacked on the selection element layer. The nanomaterial aggregate layer includes a plurality of micro conductive bodies and fine particles dispersed in a plurality of gaps between the micro conductive bodies. At least a surface of the fine particle is made of an insulating material other than silicon oxide.

According to another embodiment, a method is disclosed for manufacturing a nonvolatile memory device. The method can form a stacked body including a nanomaterial aggregate layer stacked with a selection element layer including silicon. The nanomaterial aggregate layer includes a plurality of micro conductive bodies and fine particles dispersed in a plurality of gaps between the micro conductive bodies. At least a surface of the fine particle is made of an insulating material other than silicon oxide. The method can form a pillar by selectively removing the stacked body. In addition, the method can remove a by-product adhered to a side face of the pillar by using a chemical liquid providing a higher dissolution rate of the by-product than of the insulating material.

Embodiments of the invention will now be described with reference to the drawings.

First, a first embodiment will be described.

Figure 1:
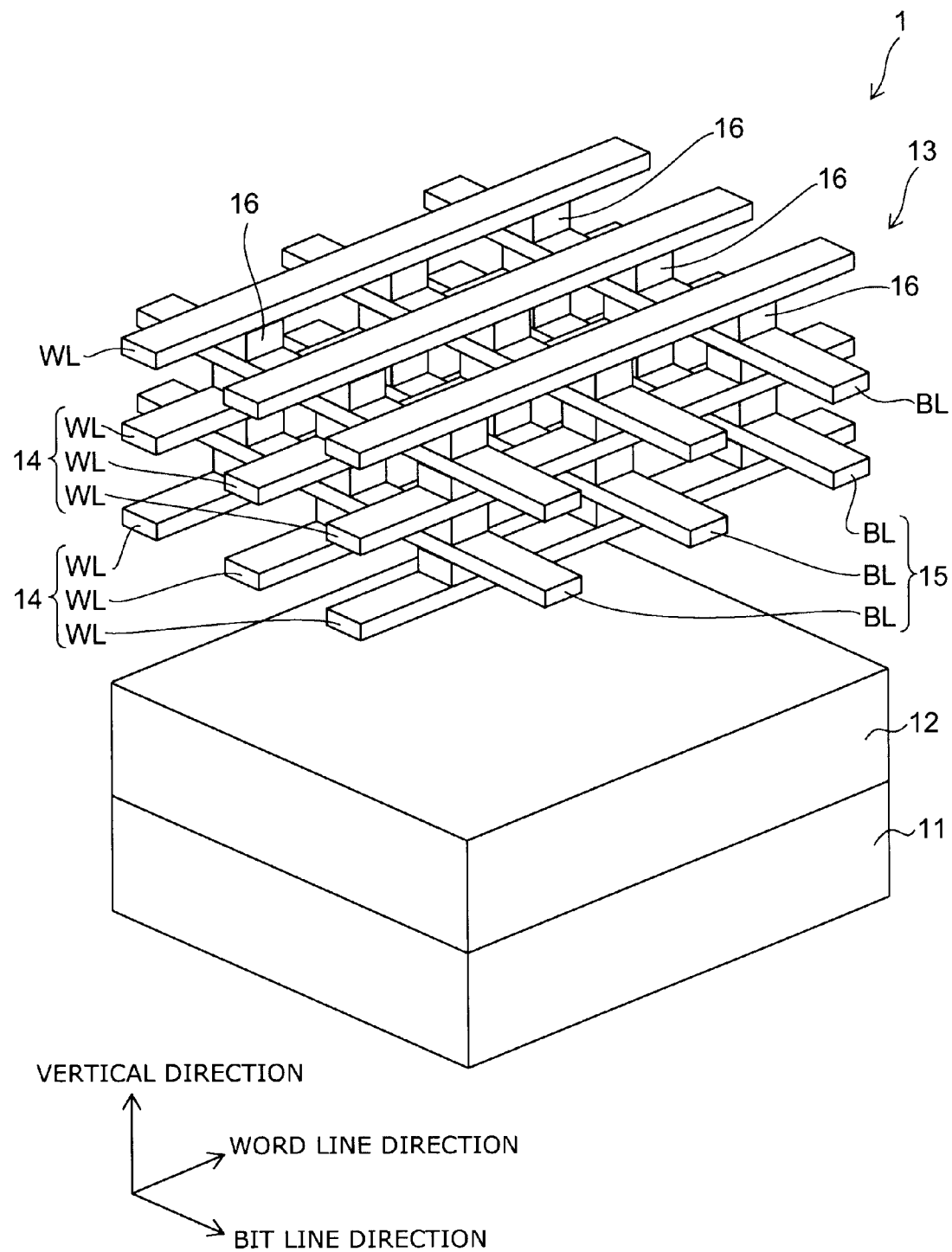
FIG. 1 is a perspective view illustrating a nonvolatile memory device according to a first embodiment.

FIG. 1 is a perspective view illustrating a nonvolatile memory device according to this embodiment.

Figure 2:
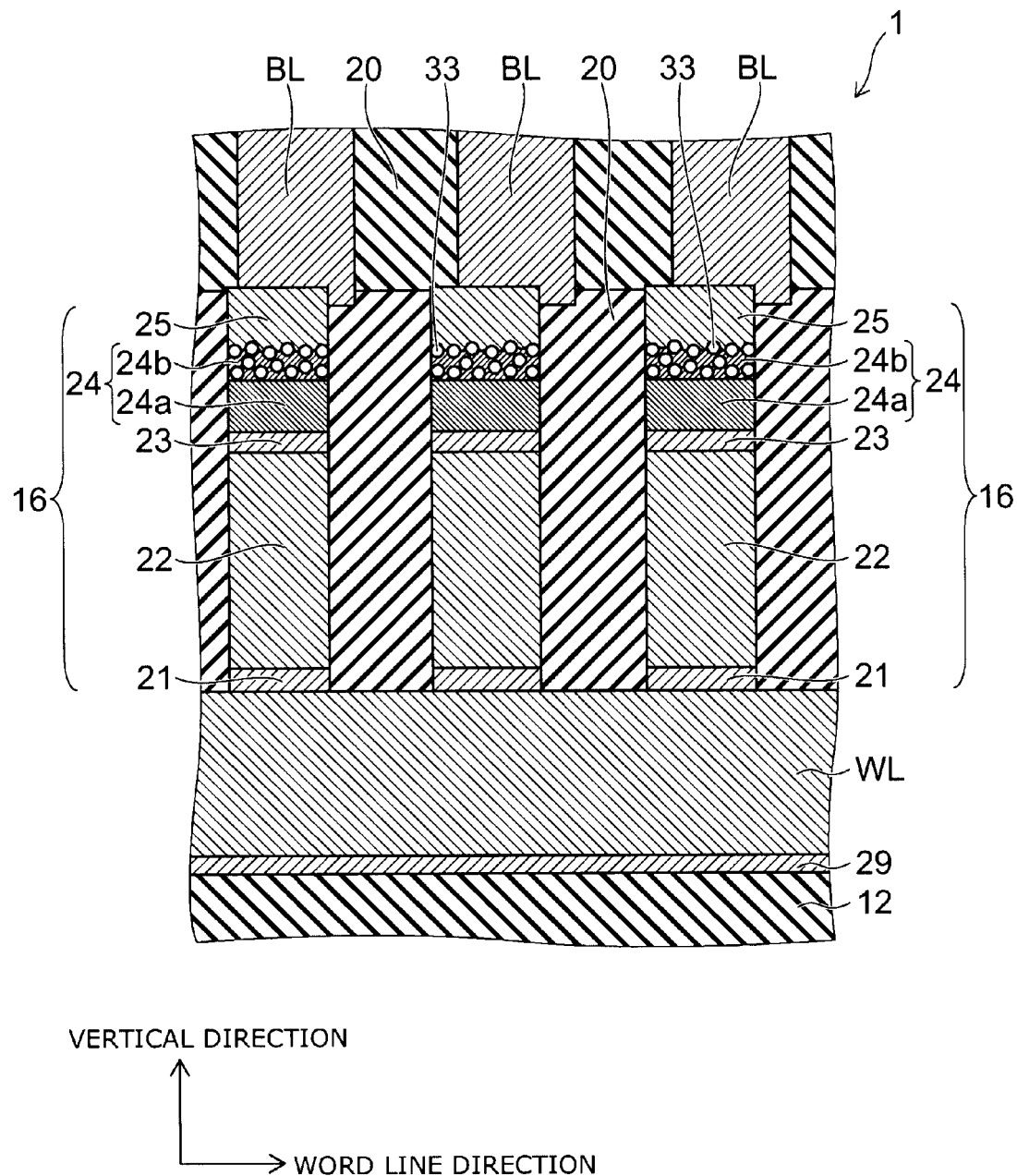
FIG. 2 is a schematic cross-sectional view illustrating the nonvolatile memory device according to the first embodiment.

FIG. 2 is a schematic cross-sectional view illustrating the nonvolatile memory device according to this embodiment.

Figure 3:
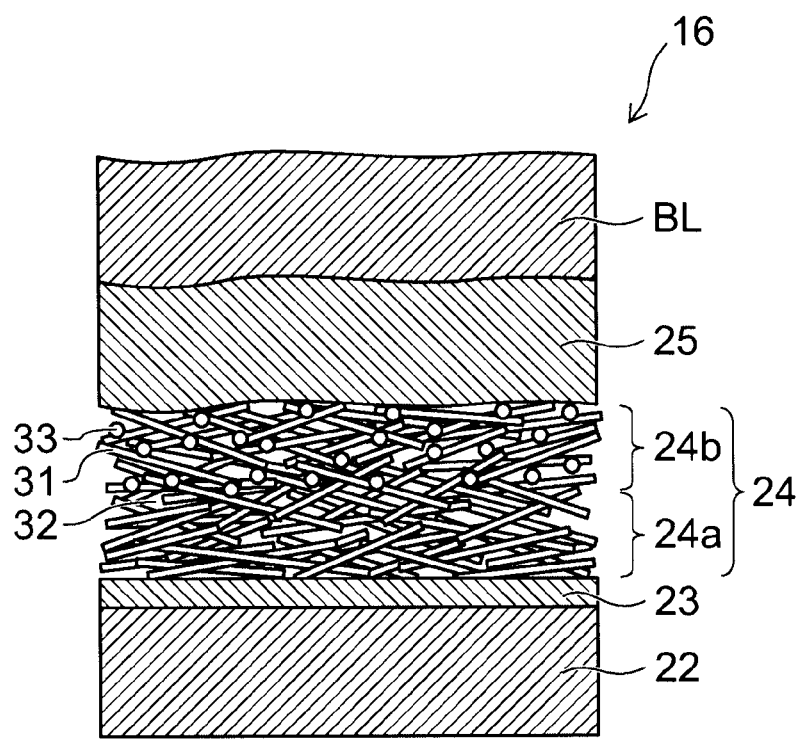
FIG. 3 is a schematic cross-sectional view illustrating a nanomaterial aggregate layer of the first embodiment.

FIG. 3 is a schematic cross-sectional view illustrating a nanomaterial aggregate layer of this embodiment.

Figure 4:
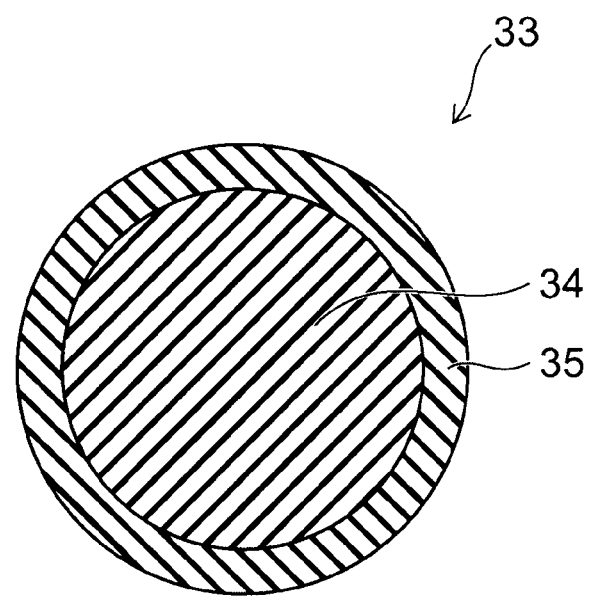
FIG. 4 is a cross-sectional view illustrating a fine particle of the first embodiment.

FIG. 4 is a cross-sectional view illustrating a fine particle of this embodiment.

In FIG. 2, CNTs 31 and a gap 32 (referring to FIG. 3) included in the nanomaterial aggregate layer 24 are not illustrated; and only fine particles 33 are illustrated schematically.

In the nonvolatile memory device 1 according to this embodiment as illustrated in FIG. 1, a silicon substrate 11 is provided; and a drive circuit (not illustrated) of the nonvolatile memory device 1 is formed on the upper layer portion and the upper face of the silicon substrate 11. An inter-layer insulating film 12 made of, for example, silicon oxide is provided on the silicon substrate 11 to bury the drive circuit; and a memory cell unit 13 is provided on the inter-layer insulating film 12.

In the memory cell unit 13, a word line interconnect layer 14 including the multiple word lines WL extending in one direction (hereinbelow referred to as the "word line direction") parallel to the upper face of the silicon substrate 11 is stacked alternately with a bit line interconnect layer 15 including the multiple bit lines BL extending in a direction (hereinbelow referred to as the "bit line direction") parallel to the upper face of the silicon substrate 11 to intersect, e.g., to be orthogonal to, the word line direction. The word lines WL do not contact each other; the bit lines BL do not contact each other; and the word lines WL do not contact the bit lines BL.

A pillar 16 is provided at each of the most proximal points between the word lines WL and the bit lines BL to extend in a direction (hereinbelow referred to as the "vertical direction") perpendicular to the upper face of the silicon substrate 11. The pillar 16 is formed between the word line WL and the bit line BL. One pillar 16 forms one memory cell. In other words, the nonvolatile memory device 1 is a cross-point device in which memory cells are disposed at every most proximal point between the word line WL and the bit line BL. An inter-layer insulating film 20 (referring to FIG. 2) is filled around the word line WL, the bit line BL, and the pillar 16.

The configuration of the pillar 16 will now be described with reference to FIG. 2.

In each of the pillars 16 as illustrated in FIG. 2, a barrier metal layer 21, a selection element layer 22, a lower electrode layer 23, the nanomaterial aggregate layer 24, and an upper electrode layer 25 are stacked in this order from the bottom upward. In the description hereinbelow of the example of the pillar 16 in which the word line WL is disposed below and the bit line BL is disposed above, the barrier metal layer 21 contacts the word line WL; and the upper electrode layer 25 contacts the bit line BL. A barrier metal layer 29 is provided between the word line WL of the lowermost layer and the inter-layer insulating film 12.

The barrier metal layer 29 is a layer to prevent diffusion and improve adhesion between the inter-layer insulating film 12 and the word line WL; and the barrier metal layer 21 is a layer to prevent diffusion and improve adhesion between the word line WL and the selection element layer 22. The barrier metal layers 29 and 21 are formed of, for example, titanium nitride (TiN) or tantalum nitride (TaN).

The selection element layer 22 includes silicon (Si) and is a layer to select whether or not to allow current to flow in the pillar 16. The selection element layer 22 is a silicon diode layer made of, for example, polysilicon in which an n-type layer having an $n^+$-type conductivity, an i-type layer made of an intrinsic semiconductor, and a p-type layer having a $p^+$-type conductivity are stacked in order from the lower layer side. Thereby, the selection element layer 22 functions as, for example, a rectifying element that allows current to flow only in the case where the potential supplied to the bit line BL is higher than the potential supplied to the word line WL and does not allow current to flow in the reverse direction. The lower electrode layer 23 and the upper electrode layer 25 are formed of a conductive material such as tungsten (W), titanium nitride (TiN), tungsten nitride (WN), tantalum nitride (TaN), or titanium silicide (TiSi). There are cases where a native oxide layer made of an oxide of the material of the lower electrode layer 23 is formed on the upper face of the lower electrode layer 23.

As illustrated in FIG. 3, the nanomaterial aggregate layer 24 is a layer including the CNTs (carbon nanotubes) 31 used as micro conductive bodies aggregated via gaps 32. That is, the interposed gap 32 is formed between the CNTs 31. The gap 32 is a layer including nitrogen gas ($N_2$) or hydrogen gas ($H_2$). Accordingly, the structure of the nanomaterial aggregate layer 24 is a hollow structure. The configuration of each of the CNTs 31 is cylindrical with a diameter of, for example, 2 to 3 nm and a length of, for example, 20 to 30 nm. The CNTs 31 extend roughly in a horizontal direction, that is, a direction parallel to the plane defined by the word line direction and the bit line direction. The number of stacks of the CNTs 31 in the thickness direction of the nanomaterial aggregate layer 24 is, for example, about several layers to several tens of layers.

The nanomaterial aggregate layer 24 is divided into a lower layer 24a and an upper layer 24b. In the upper layer 24b, the fine particles 33 which are insulators are dispersed in a plurality of gaps 32 between the CNTs 31. As illustrated in FIG. 4, the fine particle 33 includes a core portion 34 made of silicon oxide ($SiO_2$) and a surface layer portion 35 provided to cover the core portion 34. The surface layer portion 35 is made of an insulating material other than silicon oxide, e.g., a material including silicon (Si) and nitrogen (N), e.g., silicon oxynitride (SiON). In other words, at least the surface of the fine particle 33 is formed of an insulating material other than silicon oxide. The average particle size of the fine particle 33 is, for example, about 6 nm. On the other hand, the fine particles 33 are not dispersed in the lower layer 24a.

A method for manufacturing the nonvolatile memory device according to this embodiment will now be described.

FIGS. 5A to 5C, FIGS. 6A and 6B, and FIGS. 7A and 7B are cross-sectional views of processes, illustrating the method for manufacturing the nonvolatile memory device according to this embodiment.

In FIG. 5A to FIG. 7B, the CNTs 31 and the gap 32 (referring to FIG. 3) included in the nanomaterial aggregate layer 24 are not illustrated; and only the fine particles 33 are illustrated schematically.

Figure 5A:
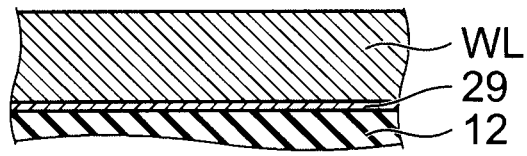
FIGS. 5A to 5C are cross-sectional views of processes, illustrating a method for manufacturing the nonvolatile memory device according to the first embodiment.

First, as illustrated in FIG. 5A, the drive circuit that drives the memory cell unit 13 (referring to FIG. 1) is formed on the upper face of the silicon substrate 11 (referring to FIG. 1). Then, the inter-layer insulating film 12 is formed on the silicon substrate 11. Continuing, the barrier metal layer 29 and the word line WL are formed on the inter-layer insulating film 12 using a damascene process or a patterning method. The damascene process is a method of making trenches in the upper layer portion of the inter-layer insulating film 12 and filling a conductive material into the trenches. The patterning method is a method of forming a conductive film on the entire surface, dividing the conductive film using RIE (reactive ion etching), and filling an insulating layer therebetween. The word line WL is multiply formed to extend mutually parallel to the word line direction. The word line interconnect layer 14 is formed of the multiple word lines WL.

Figure 5B:
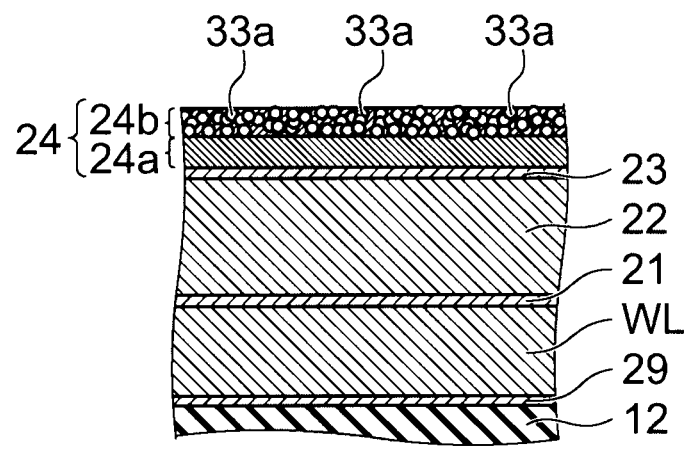

Then, as illustrated in FIG. 5B, the barrier metal layer 21 is formed on the word line WL by depositing, for example, titanium nitride (TiN) or tantalum nitride (TaN). Continuing, the selection element layer 22 which is, for example, a silicon diode layer is formed by depositing silicon while introducing, for example, an impurity. Then, the lower electrode layer 23 is formed by depositing, for example, tungsten (W). In some cases, a native oxide layer is formed on the upper face of the lower electrode layer 23 at this time.

Continuing, a dispersion solution in which the carbon nanotubes (the CNTs) 31 (referring to FIG. 3) are dispersed in water is coated on the lower electrode layer 23 and dried. The lower layer 24a of the nanomaterial aggregate layer 24 is formed by multiply repeating the coating and the drying. In the lower layer 24a, the multiple CNTs 31 (referring to FIG. 3) are loosely bonded to form the gap 32 (referring to FIG. 3) between the CNTs 31. The direction in which the CNTs 31 extend approaches the horizontal direction when the thickness of the dispersion solution is reduced by the drying.

Then, a dispersion solution in which the CNTs 31 and fine particles 33a are dispersed in water is coated on the lower layer 24a of the nanomaterial aggregate layer 24 and dried. At this stage, the surface of the fine particle 33a is not nitrided; and the entire fine particle 33a is formed of silicon oxide. The upper layer 24b of the nanomaterial aggregate layer 24 is formed by multiply repeating the coating and the drying. At this time, the direction in which the CNTs 31 extend approaches the horizontal direction when the thickness of the dispersion solution is reduced by the drying. In the upper layer 24b as well, similarly to the lower layer 24a, although the multiple CNTs 31 (referring to FIG. 3) are loosely bonded to form the gap 32 (referring to FIG. 3) between the CNTs 31, the gap 32 is smaller by the amount of the fine particles 33a dispersed between the CNTs 31. Thus, the nanomaterial aggregate layer 24 is formed in which the fine particles 33a are dispersed only in the upper layer 24b.

Figure 5C:
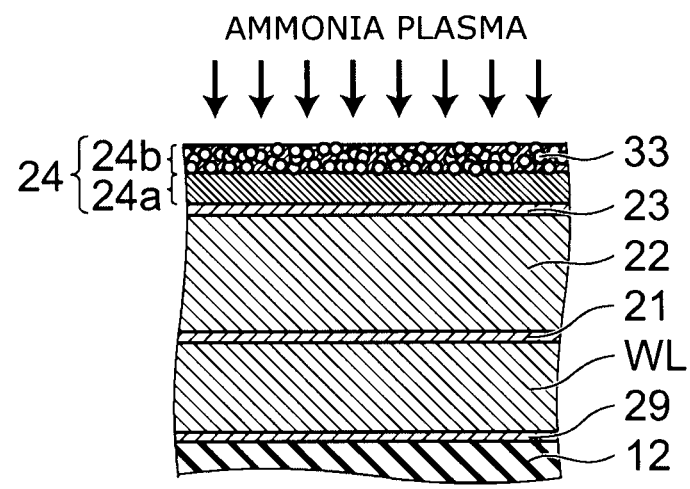
Figure 5C:

Then, as illustrated in FIG. 5C, a plasma of ammonia ($NH_3$) is brought into contact with the nanomaterial aggregate layer 24 from the upper face side. Thereby, the ammonia plasma penetrates into the nanomaterial aggregate layer 24 to perform plasma nitriding of the surface of the fine particle 33a dispersed in the upper layer 24b. At this time, the processing temperature is not less than, for example, 250° C. and not more than, for example, 600° C. As a result, as illustrated in FIG. 4, the nitrided portion of the fine particle 33a (referring to FIG. 5B) becomes a surface layer portion 35 including silicon and nitrogen; and the unnitrided portion in which the silicon oxide remains as-is becomes the core portion 34. Thereby, the fine particle 33a changes into the fine particle 33.

Because the ammonia plasma penetrates into the layer of the nanomaterial aggregate layer 24 from the upper face side, the nitrogen concentration in the nanomaterial aggregate layer 24 after the nitriding process has a concentration distribution in the vertical direction with a higher nitrogen concentration upward and a lower nitrogen concentration downward. At this time, carbon impurities such as the amorphous carbon included in the CNT dispersion solution are nitrided by the ammonia plasma and discharged as carbon nitride gas. The carbon atoms included in the CNTs 31 are securely bonded to the other carbon atoms and therefore are substantially not removed by the nitriding.

Figure 6A:
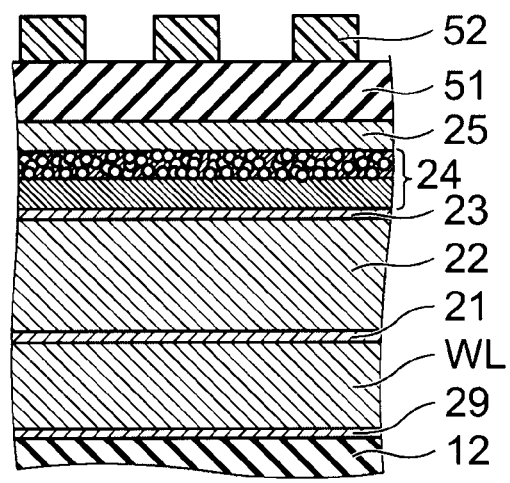
FIGS. 6A and 6B are cross-sectional views of processes, illustrating the method for manufacturing the nonvolatile memory device according to the first embodiment.

Then, as illustrated in FIG. 6A, the upper electrode layer 25 is formed on the nanomaterial aggregate layer 24 by depositing a conductive material such as, for example, tungsten (W). At this time, although a portion of the conductive material enters into the gap 32 (referring to FIG. 3) of the nanomaterial aggregate layer 24, the penetration of the conductive material is suppressed because the gap 32 is reduced by the amount of the fine particles 33 dispersed in the upper layer 24b of the nanomaterial aggregate layer 24. Then, a hard mask 51 made of, for example, silicon oxide is formed on the upper electrode layer 25. Continuing, a resist film is formed on the hard mask 51. Then, a resist pattern 52 is formed by patterning the resist film into a matrix configuration using lithography.

Figure 6B:
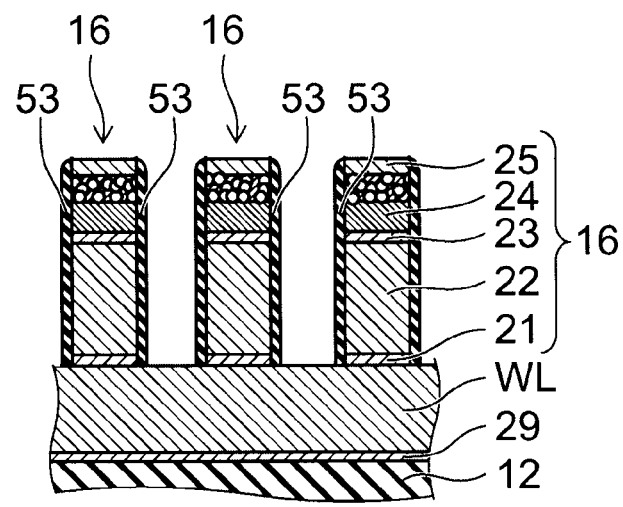

Continuing as illustrated in FIG. 6B, the pattern of the resist pattern 52 is transferred onto the hard mask 51 by performing RIE using the resist pattern 52 as a mask. Then, the upper electrode layer 25, the nanomaterial aggregate layer 24, the lower electrode layer 23, the selection element layer 22, and the barrier metal layer 21 are patterned by being selectively removed by performing RIE using the resist pattern 52 and the hard mask 51 as a mask. Thereby, the pillar 16 is formed. At this time, a by-product (a deposit) 53 having a main component of silicon oxide is adhered to the side face of the pillar 16. The entire resist pattern 52 and the greater part of the hard mask 51 vanish during the RIE.

Then, as illustrated in FIG. 7A, the by-product 53 (referring to FIG. 6B) is removed by performing wet cleaning using, for example, a hydrofluoric acid-based solution, e.g., DHF (diluted hydrofluoric acid) or BHF (buffered hydrofluoric acid). At this time, as illustrated in FIG. 4, the surface layer portion 35 does not dissolve in the hydrofluoric acid-based solution and accordingly the fine particles 33 are not removed because the surface layer portion 35 of the fine particle 33 is formed of an insulating material other than silicon oxide, e.g., silicon oxynitride. Although the chemical liquid used to remove the by-product 53 is not limited to the hydrofluoric acid-based solution, it is necessary for the chemical liquid to provide a higher dissolution rate of the by-product 53 than of the surface layer portion 35 of the fine particle 33.

Continuing as illustrated in FIG. 7B, the inter-layer insulating film 20 is formed by depositing, for example, silicon oxide between the pillars 16. Then, the upper face of the upper electrode layer 25 is exposed by performing CMP (chemical mechanical polishing).

Then, as illustrated in FIG. 2, the multiple bit lines BL are formed on the upper electrode layer 25 using a damascene process or a patterning method. The bit line interconnect layer 15 is formed of the multiple bit lines BL extending in the bit line direction. Then, the pillar 16 is formed by stacking the barrier metal layer 21, the selection element layer 22, the lower electrode layer 23, the nanomaterial aggregate layer 24, and the upper electrode layer 25 in this order and by patterning using methods similar to those described above; the by-product 53 (referring to FIG. 6B) is cleaned using the hydrofluoric acid-based solution; and the inter-layer insulating film 20 is filled. Thus, the pillar 16 is formed on the bit line BL. When forming the pillar 16, the stacking order of the n-type layer, the i-type layer, and the p-type layer of the selection element layer 22 is reversed from that of the pillar 16 formed on the word line WL described above. Thereafter, the word line interconnect layer 14, the multiple pillars 16, the bit line interconnect layer 15, and the multiple pillars 16 are formed repeatedly using similar methods. Thereby, the nonvolatile memory device 1 according to this embodiment is manufactured.

Operations of this embodiment will now be described.

In the nonvolatile memory device 1 according to this embodiment, the nanomaterial aggregate layer 24 can have two states of a "high resistance state" and a "low resistance state." The mechanism, while not completely elucidated, is considered to be, for example, as follows.

When a voltage is not applied between the lower electrode layer 23 and the upper electrode layer 25, the CNTs 31 of the nanomaterial aggregate layer 24 are roughly in a state of being isolated from each other; and the nanomaterial aggregate layer 24 is in the "high resistance state." On the other hand, when a voltage is applied between the lower electrode layer 23 and the upper electrode layer 25, Coulomb forces occur between the CNTs 31; and the CNTs 31 attract each other. Then, when the voltage is continuously applied for at least a constant amount of time, the CNTs 31 move and rotate due to the Coulomb forces and contact adjacent CNTs 31; and a current path is formed between the lower electrode layer 23 and the upper electrode layer 25 via the multiple CNTs 31. As a result, the nanomaterial aggregate layer 24 is switched to the "low resistance state." This state is maintained even when the voltage is no longer applied between the lower electrode layer 23 and the upper electrode layer 25. When a short pulse voltage, e.g., on the order of nanoseconds, is applied between the lower electrode layer 23 and the upper electrode layer 25, the contact portions between the CNTs 31 generate heat; and the CNTs 31 separate from each other. As a result, the nanomaterial aggregate layer 24 returns to the "high resistance state." Thus, the nanomaterial aggregate layer 24 can have the two states of the "high resistance state" and the "low resistance state." Thereby, binary data can be stored.

Effects of this embodiment will now be described.

According to this embodiment, a resistance change layer is formed of the nanomaterial aggregate layer 24 including the aggregated carbon nanotubes (the CNTs) 31. Thereby, a ReRAM is realized. In conventional resistance change layers using metal oxides, operations were unfortunately unstable because metal oxides normally are insulators. Conversely, according to this embodiment, it is possible to drive with a low voltage and the operations are stable because the resistance change layer is formed using CNTs which are conductors. Thereby, a nonvolatile memory device having high reliability can be realized.

In this embodiment, the fine particles 33 are dispersed in the upper layer 24b of the nanomaterial aggregate layer 24. Thereby, the bonding force between the CNTs 31 increases and the entire nanomaterial aggregate layer 24 is stronger. Therefore, the pillar 16 can be prevented from collapsing in the process of forming the pillar 16 illustrated in FIG. 6B. Because the gap 32 is reduced by dispersing the fine particles 33, the permeation of the conductive material of the upper electrode layer 25 into the nanomaterial aggregate layer 24 can be suppressed when forming the upper electrode layer 25 on the nanomaterial aggregate layer 24 in the process illustrated in FIG. 6A. Thereby, a flat interface can be formed stably between the nanomaterial aggregate layer 24 and the upper electrode layer 25. Thereby, the pillar 16 can be downscaled to increase the bit density. Further, by dispersing the insulative fine particles 33 in the upper layer 24b of the nanomaterial aggregate layer 24, the resistance of the nanomaterial aggregate layer 24 in the high resistance state is higher than that of the case where the fine particles 33 are not dispersed. Thereby, the margin of the read-out operation of the memory cells increases and operations are stabilized.

Moreover, in this embodiment, the by-product 53 (referring to FIG. 6B) is removed using the hydrofluoric acid-based solution in the process illustrated in FIG. 7A. Thereby, there are no by-products 53 on the side face of the pillar 16 in the nonvolatile memory device 1 after completion. As a result, a nonvolatile memory device having a high operational reliability can be obtained.

Also in this embodiment, the surface of the fine particle 33a made of silicon oxide is nitrided in the process illustrated in FIG. 5C. Thereby, the fine particle 33 is formed in which the core portion 34 is covered with the surface layer portion 35 made of silicon oxynitride. As a result, the fine particles 33 are not removed by dissolving in the cleaning process using the hydrofluoric acid-based solution illustrated in FIG. 7A. Accordingly, the nanomaterial aggregate layer 24 does not become fragile due to the fine particles 33 being removed; and the collapse of the pillar 16 can be prevented. As a result, the pillar 16 can be downscaled; and the nonvolatile memory device 1 having a high bit density can be manufactured.

Conversely, supposing that the fine particles 33a (referring to FIG. 5B) dispersed in the nanomaterial aggregate layer 24 are not nitrided, the fine particles 33a made of the same silicon oxide as the by-product 53 also is undesirably dissolved and removed when removing the by-product 53 in the cleaning process illustrated in FIG. 7A. Thereby, the upper layer 24b of the nanomaterial aggregate layer 24 becomes fragile; and there are cases where the pillar 16 undesirably collapses when the pillar 16 is downscaled. In the case where the pillar 16 collapses, the memory cell unfortunately becomes unusable.

Further, in this embodiment, carbon impurities such as amorphous carbon mixed into the dispersion solution can be removed in the plasma nitriding process illustrated in FIG. 5C. Thereby, the CNTs 31 move more easily in the nanomaterial aggregate layer 24; and the operational reliability of the nonvolatile memory device 1 increases.

The processing temperature is 250 to 600° C. in the plasma nitriding process illustrated in FIG. 5C. The amorphous carbon which is an impurity can be removed reliably by using the processing temperature not less than 250° C. On the other hand, damage to the CNTs 31 by the plasma can be suppressed by using the processing temperature not more than 600° C. Therefore, it is favorable for the processing temperature of the plasma nitriding to be 250 to 600° C.

In this embodiment, the fine particles 33a made of silicon oxide are dispersed in the CNT dispersion solution used to form the upper layer 24b of the nanomaterial aggregate layer 24. Thereby, the coalescing of the CNTs 31 in the dispersion solution can be suppressed. The effect of suppressing the coalescing of the CNTs 31 is greater for the fine particles 33a made of the unnitrided silicon oxide than for the fine particles 33 having the nitrided surface. Therefore, according to this embodiment, the coalescing of the CNTs 31 in the dispersion solution prior to the coating can be suppressed effectively. In the nanomaterial aggregate layer 24 after the coating as well, the coalescing of the CNTs 31 can be suppressed effectively. Then, the surfaces of the fine particles 33a are subsequently nitrided. Thereby, in the nonvolatile memory device 1 according to this embodiment, the strength of the nanomaterial aggregate layer 24 can be ensured and the pillar 16 can be downscaled by preventing the fine particles 33a from dissolving in the cleaning process by nitriding the fine particles 33a while suppressing the coalescing of the CNTs 31 at the coating stage and ensuring the operational reliability of the memory cells.

A second embodiment will now be described.

Figure 8:
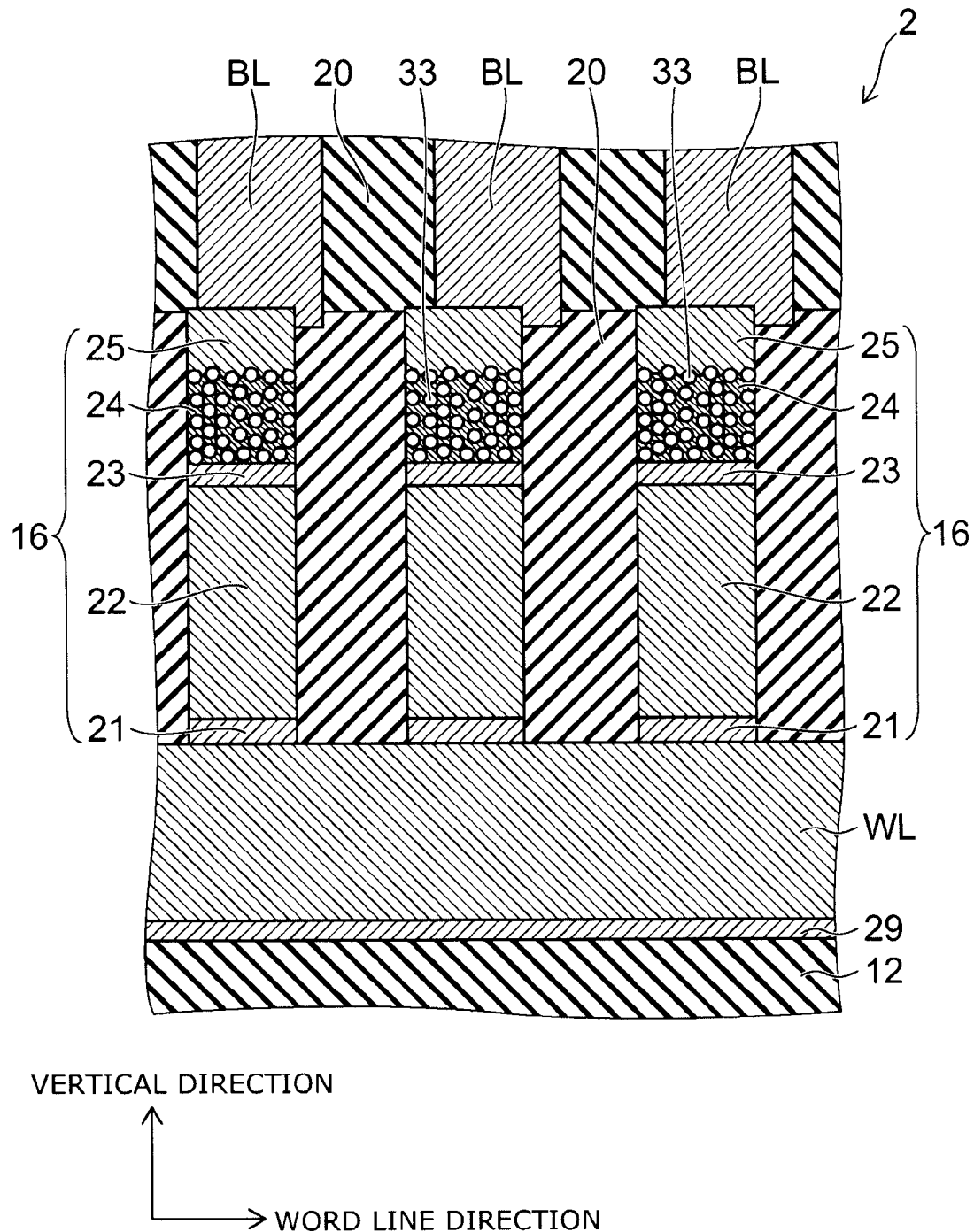
FIG. 8 is a schematic cross-sectional view illustrating a nonvolatile memory device according to a second embodiment.

FIG. 8 is a schematic cross-sectional view illustrating a nonvolatile memory device according to this embodiment.

Figure 9:
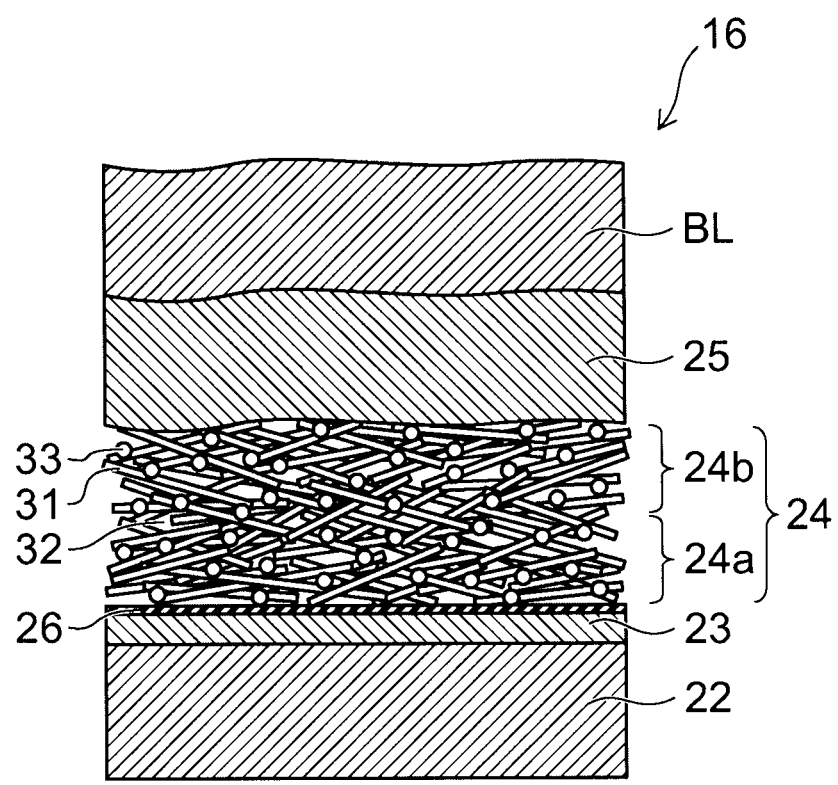
FIG. 9 is a schematic cross-sectional view illustrating a nanomaterial aggregate layer of the second embodiment.

FIG. 9 is a schematic cross-sectional view illustrating a nanomaterial aggregate layer of this embodiment.

In FIG. 8, the CNTs 31 and the gap 32 (referring to FIG. 9) included in the nanomaterial aggregate layer 24 are not illustrated; and only the fine particles 33 are illustrated schematically.

As illustrated in FIG. 8 and FIG. 9, the nonvolatile memory device 2 according to this embodiment is different from the nonvolatile memory device 1 (referring to FIG. 2 and FIG. 3) according to the first embodiment described above in that the fine particles 33 are dispersed in the entire nanomaterial aggregate layer 24. Further, in this embodiment, the native oxide layer is removed from the upper face of the lower electrode layer 23 and a thin nitrided layer 26 is formed instead. The nitrided layer 26 is formed in the interface between the lower electrode layer 23 and the nanomaterial aggregate layer 24 and is formed of a nitride of the material of the lower electrode layer. For example, in the case where the lower electrode layer 23 is made of tungsten, the nitrided layer 26 is made of tungsten nitride.

A method for manufacturing the nonvolatile memory device according to this embodiment will now be described.

FIGS. 10A and 10B are cross-sectional views of processes, illustrating the method for manufacturing the nonvolatile memory device according to this embodiment.

In FIGS. 10A and 10B, the CNTs 31 and the gap 32 (referring to FIG. 9) included in the nanomaterial aggregate layer 24 are not illustrated; and only the fine particles 33 are illustrated schematically.

First, as illustrated in FIG. 10A, the inter-layer insulating film 12, the barrier metal layer 29, the word line WL, the barrier metal layer 21, the selection element layer 22, and the lower electrode layer 23 are stacked in this order on the silicon substrate 11 (referring to FIG. 1) using methods similar to those of the first embodiment described above. At this time, a native oxide layer (not illustrated) is formed on the upper face of the lower electrode layer 23. This is similar to the first embodiment described above.

Then, the dispersion solution in which the CNTs 31 and the fine particles 33a are dispersed in water is coated on the lower electrode layer 23 and dried. The nanomaterial aggregate layer 24 is formed by multiply repeating the coating and the drying. The fine particles 33a made of silicon oxide are dispersed in the entire nanomaterial aggregate layer 24.

Continuing as illustrated in FIG. 10B, the nanomaterial aggregate layer 24 is brought into contact with heated ammonia ($NH_3$) gas. At this time, the processing temperature is not less than, for example, 450° C. and not more than, for example, 750° C. The ammonia gas penetrates into the gap 32 of the nanomaterial aggregate layer 24 to reach the lower face of the nanomaterial aggregate layer 24. Thereby, the surfaces of the fine particles 33a dispersed in the entire nanomaterial aggregate layer 24 are thermally nitrided. Thereby, the surface layer portion 35 made of silicon oxynitride is formed on the fine particle 33a to form the fine particle 33 (referring to FIG. 4).

At this time, the nitrogen concentration of the nanomaterial aggregate layer 24 after the nitriding process has a distribution in the vertical direction in which the nitrogen concentration is higher upward and the nitrogen concentration is lower downward similarly to the first embodiment described above because the ammonia gas penetrates into the layer of the nanomaterial aggregate layer 24 from the upper face side. At this time, carbon impurities such as the amorphous carbon included in the CNT dispersion solution are nitrided by the high-temperature ammonia gas and discharged as carbon nitride gas. The carbon atoms included in the CNTs 31 are securely bonded to the other carbon atoms and therefore are substantially not removed by the nitriding. The ammonia gas reaches the interface between the lower electrode layer 23 and the nanomaterial aggregate layer 24 to reduce the native oxide layer formed in the upper face of the lower electrode layer 23 and nitride the upper face of the lower electrode layer 23; and the nitrided layer 26 is formed.

The subsequent processes are similar to those of the first embodiment described above. In other words, the upper electrode layer 25 is formed on the nanomaterial aggregate layer 24. Then, the stacked film made of the barrier metal layer 21, the selection element layer 22, the lower electrode layer 23, the nanomaterial aggregate layer 24, and the upper electrode layer 25 is etched to form the pillar 16. Continuing, the by-product 53 is removed from the side face of the pillar 16 by cleaning using a hydrofluoric acid-based solution. Then, the inter-layer insulating film 20 is filled between the pillars 16. Continuing, the bit line BL is formed. By repeating the processes recited above, the nonvolatile memory device 2 according to this embodiment is manufactured.

Effects of this embodiment will now be described.

In this embodiment, the strength of the nanomaterial aggregate layer 24 is higher than that of the first embodiment described above because the fine particles 33 are dispersed in the entire nanomaterial aggregate layer 24. Thereby, the pillar 16 can be formed more stably. As a result, a finer pillar 16 can be formed; and the nonvolatile memory device 2 having a higher bit density can be manufactured.

The wettability of the CNT dispersion solution is high because the native oxide layer is formed on the upper face of the lower electrode layer 23 in the process of coating the CNT dispersion solution onto the lower electrode layer 23 illustrated in FIG. 10A. This is similar also for the first embodiment described above. However, in this embodiment, the electrical characteristics of the nonvolatile memory device 2 after completion are good because the native oxide layer of the lower electrode layer 23 is reduced in the thermal nitriding process illustrated in FIG. 10B.

In the thermal nitriding process illustrated in FIG. 10B, the processing temperature is 450 to 750° C. The amorphous carbon which is an impurity can be removed reliably by using the processing temperature not less than 450° C. On the other hand, damage to the CNTs 31 by the ammonia gas can be suppressed by using the processing temperature not more than 750° C. Also, damage to the transistors (not illustrated) of the drive circuit formed on the silicon substrate 11 can be prevented. Therefore, it is favorable for the processing temperature of the thermal nitride processing using the ammonia gas to be 450 to 750° C.

Otherwise, the configuration, method for manufacturing, operations, and effects of this embodiment are similar to those of the first embodiment described above.

The first and second embodiments described above are practicable in combination with each other. For example, in the first embodiment described above, the fine particles 33a made of silicon oxide may be dispersed in the entire nanomaterial aggregate layer 24 in the process illustrated in FIG. 5B. In such a case, it is favorable for the plasma to reach the lower face of the nanomaterial aggregate layer 24 and nitride all of the fine particles 33a in the subsequent plasma nitriding process illustrated in FIG. 5C. On the other hand, in the second embodiment described above, the fine particles 33a may be dispersed in only the upper layer of the nanomaterial aggregate layer 24 in the process illustrated in FIG. 10A.

Although the example is illustrated in the first and second embodiments described above in which only the surface of the fine particle 33a is nitrided, the invention is not limited thereto. The entire fine particle 33a may be nitrided. The nitriding method of the fine particle is not limited to the plasma nitriding method using ammonia plasma and the thermal nitriding method using ammonia gas. A fine particle having its surface or its entirety made of silicon oxynitride or silicon nitride may be dispersed in the CNT dispersion solution from the start. In such a case, the subsequent nitriding process may be omitted. The composition of the surface of the fine particle is not limited to silicon oxynitride and silicon nitride. It is sufficient to use an insulating material having a dissolving selectivity with the by-product 53 which has a main component of silicon oxide. For example, various metal oxides, mixtures thereof, or compounds thereof may be used.

Although the example is illustrated in the first and second embodiments described above in which carbon nanotubes (CNTs) are used as the microstructural bodies, the invention is not limited thereto. The microstructural body included in the nanomaterial aggregate layer 24 may include a carbon nanomaterial having a nanoscale crystalline structure such as fullerene, graphene, and carbon nanoribbon or a nanoscale structural body made of a conductive material other than carbon.

Although the example is illustrated in the first and second embodiments described above in which the selection element layer 22 is a silicon diode layer, the invention is not limited thereto. For example, a Schottky diode made of a silicon layer and a metal layer may be used; and an npn-type or pnp-type silicon transistor layer may be used.

Although the example is illustrated in the first and second embodiments described above in which a hydrofluoric acid-based solution such as DHF or BHF is used as the chemical liquid to remove the by-product 53, the invention is not limited thereto. It is sufficient for the chemical liquid to provide a higher dissolution rate of the by-product 53 than of the insulating material of the surface layer portion 35 of the fine particle 33.

According to the embodiments described above, a nonvolatile memory device having a high bit density and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A nonvolatile memory device, comprising:
a selection element layer including silicon; and
a nanomaterial aggregate layer stacked on the selection element layer, the nanomaterial aggregate layer including a plurality of micro conductive bodies and fine particles dispersed in a plurality of gaps between the micro conductive bodies, at least a surface of the fine particles being made of an insulating material including silicon and nitrogen.

2. The device according to claim 1, wherein the fine particle includes:
a core portion made of silicon oxide; and
a surface layer portion made of the insulating material to cover the core portion.

3. The device according to claim 1, further comprising:
an electrode layer provided between the selection element layer and the nanomaterial aggregate layer; and
a nitrided layer formed between the electrode layer and the nanomaterial aggregate layer, the nitrided layer being made of a nitride of a material of the electrode layer.

4. The device according to claim 1, wherein the fine particles are dispersed only in an upper portion of the nanomaterial aggregate layer.

5. The device according to claim 1, wherein the fine particles are dispersed in the entire nanomaterial aggregate layer.

6. The device according to claim 1, wherein the micro conductive body is a carbon nanotube.

7. The device according to claim 1, further comprising:
a word line interconnect layer including a plurality of word lines extending in a first direction; and
a bit line interconnect layer including a plurality of bit lines extending in a second direction intersecting the first direction,
the word line interconnect layer and the bit line interconnect layer being stacked alternately, and
the selection element layer and the nanomaterial aggregate layer being stacked to form a pillar between one of the word lines and one of the bit lines.

* * * * *